United States Patent [19]
Yee

[11] Patent Number: 5,818,087
[45] Date of Patent: Oct. 6, 1998

[54] ELECTROSTATIC-DISCHARGE PROTECTING CIRCUIT AND METHOD

[75] Inventor: Hyeok Jae Yee, Seoul, Rep. of Korea

[73] Assignee: LG Semicon, Ltd., Chungcheongbuk-do, Rep. of Korea

[21] Appl. No.: 747,659

[22] Filed: Nov. 13, 1996

[30] Foreign Application Priority Data

Apr. 3, 1996 [KR] Rep. of Korea .................. 10068/1996

[51] Int. Cl.⁶ ................................................. H01L 23/62
[52] U.S. Cl. .............................................................. 257/355
[58] Field of Search ............................................. 257/355

[56] References Cited

U.S. PATENT DOCUMENTS 5,072,271  12/1991  Shimizu et al. .

OTHER PUBLICATIONS

"ESD: A Pervasive Reliability Concern for IC Technologies," Duvvury et al., *Proceedings of the IEEE*, vol. 81, No. 5. May 1993, pp. 690–702.

"Impact of Snapback–Induced Hole Injection on Gate Oxide Realiability of N–MOSFET's," Mistry et al., *IEEE Electron Device Letters*, vol. 11, No. 10, Oct. 1990, pp. 460–462.

*Primary Examiner*—Stephen Meier

[57] ABSTRACT

An electrostatic-discharge (ESD) protecting circuit of a semiconductor device prevents damage from an ESD applied to an internal circuit through an input or output pad. The thickness of respective gate insulating layers of respective active devices of the electrostatic-discharge protecting circuit and internal circuit, which are formed within a given radius in the range of about 350μm to about 1000μm from the electrostatic-discharge protecting circuit, is thicker than the thickness of gate insulating layers of active devices formed outside the radius.

7 Claims, 7 Drawing Sheets

ELECTROSTATIC-DISCHARGE PROTECTING CIRCUIT AND METHOD

BACKGROUND OF THE INVENTION

The present invention relates to an electrostatic-discharge (ESD) protecting circuit and method, and more particularly, to an electrostatic-discharge (ESD) protecting circuit and method in which ESD characteristic is improved to thereby prevent an internal circuit of a semiconductor device from being destroyed due to about 200–2,000V of static electricity.

Generally, an ESD protecting circuit in a semiconductor device is designed to prevent an internal circuit from being destroyed by 200–2,000V of static electricity. For this purpose, the ESD protecting circuit uses a silicon controlled rectifier (SCR), or a field transistor, diode and bipolar transistor. However, due to increased integration of semiconductor devices, when a field transistor or bipolar transistor is used in the protecting circuit, a gate oxide layer to which high voltage is applied becomes so thin that the active devices included in the ESD protecting circuit, and in the internal circuit have ESD characteristics inferior to that of other active devices of the internal circuit. According to the prior art, the ESD characteristic is evaluated using the human body model (HBM) or the machine model (MM). In a currently manufactured semiconductor device, its internal circuit is formed using the same thickness of a gate oxide in one chip. For example, in case of 64M DRAM, a gate oxide layer having a thickness of about 100Å is used over the whole chip.

With higher integration of semiconductor devices, the package size is increased, and the gate oxide layer becomes thin. Accordingly, a technique which evaluates the ESD characteristic using the charged device model (CDM) has become powerful. The portion of the circuit destroyed by the HBM or MM method is the edges of a junction, while the portion destroyed by CDM method is mainly a gate oxide layer of the active devices. The time required for an ESD pulse applied by CDM method to reach maximum current is about 1 nsec, which is about the same time needed for the ESD protecting circuit to operate.

Accordingly, even before the operation of the ESD protecting circuit, the ESD pulse destroys the respective gate oxide layers of the active device included in the ESD protecting circuit, and of the active device connected to the internal circuit. Therefore, for higher integration of semiconductor devices, the ESD protecting circuit and the internal circuit around the protecting circuit as well as the active device connected to the ESD protecting circuit are affected by the electrostatic discharge.

FIG. 1 is a layout in which the active device is placed on a portion having a predetermined distance from the ESD protecting circuit, and FIG. 2 shows the change of the ESD voltage. Referring to FIGS. 1 and 2, it is known that the longer the distance is between the active device and the ESD protecting circuit, (for example, 50μm, 90μm, 120μm, or 150μm), the larger the ESD voltage that can be tolerated before failure occurs. That is, the ESD failure voltage of the active device placed apart from the ESD protecting circuit by about 150μm becomes about 1,500V, but does not reach 2,000V. This is because the excess charge, for example, hot carrier, caused by the ESD is not fully grounded, and affects adjacent active devices through the substrate, destroying the gate oxide layer or junction. Accordingly, the gate oxide layers of the active devices within the distance of about 200 to 300μm may be easily destroyed under the influence of the ESD.

Moreover, according to higher integration of semiconductor devices, a semiconductor device package is presently formed using a lead on chip (LOC) configuration suitable for increasing the packaging density. As shown in FIG. 1, the ESD protecting circuit in a LOC configuration is placed at the center, and the internal circuits are placed on both sides of the ESD protecting circuit. This increases the packaging density, but decreases the ESD breakdown voltage.

In addition, according to higher integration of semiconductor devices, the gate oxide layer becomes thinner such that the gate oxide layer of the active device constructing the internal circuit is damaged by the excess charge. Accordingly, as a method for preventing the gate oxide layer from being destroyed, it has been proposed to form a guard ring around the ESD protecting circuit to absorb the excess charge using the guard ring. This technique will be explained below with reference to the accompanying drawings.

FIG. 3 is a layout of an ESD protecting circuit of a conventional semiconductor device, and FIG. 4 is a cross-sectional view of a conventional ESD protecting circuit, taken along line IV—IV of FIG. 3. Referring to FIGS. 3 and 4, the conventional ESD protecting circuit 150 is formed between a signal input pad 100 of a high integration semiconductor device, and internal circuit 200. Signal input pad 100 is connected to the input terminal of internal circuit 200, and resistors R1 and R2 are connected between the signal input terminal 100 and input terminal of the internal circuit 200. Resistor R1 is a protection resistor, and is formed with a diffusion layer formed on the active region of a semiconductor substrate. Resistor R2 is a parasitic resistor, and is formed with a metal line formed on the semiconductor substrate. ESD protecting circuit 150 is formed between resistors R1 and R2, and includes parasitic bipolar transistors which will be explained below.

The conventional ESD protecting circuit is constructed in such a manner that a plurality of N+ type impurity regions 111, 112 and 113 are formed on a p-type semiconductor substrate 101 spaced apart from one another, and a heavily doped P+ type impurity region 115 is formed on p-type semiconductor substrate 101 around the N+ type impurity regions spaced therefrom. Here, N+ type impurity regions 111 and 113 are connected to a power supply terminal Vcc or ground Vss, and N+ type impurity region 112 is connected to the input pad 100. In this construction, N+ type impurity regions 111, 112 and 113 are connected to p-type semiconductor substrate 101, constructing a plurality of parasitic bipolar transistors 114. That is, N+ type impurity region 112 is used as a collector region of the parasitic bipolar transistor, and the N+ type impurity regions 111 and 113 are used as emitter regions thereof and P-type semiconductor substrate 101 acts as a base region thereof.

A gate oxide layer 209 and gate electrode 210 are formed on a portion of substrate 101 isolated from heavily doped P+ type impurity region 115. N+ type impurity regions 207 and 208 are formed on a portion of the substrate 101 on both sides of the gate electrode 210. The N+ type impurity regions 207 and 208, gate oxide layer 209 and gate electrode 210 form an MOS transistor 211 of the active device of the internal circuit.

In the conventional ESD protecting circuit described above, when the excess voltage caused by the ESD applied through input pad 100 is not emitted outside the device through the parasitic bipolar transistor 114, it is absorbed by the heavily doped P+ type impurity region 115. That is, when the excess voltage caused by the ESD is applied to the input pad 100, electrons which are not emitted through the parasitic bipolar transistor 114 are seized or trapped by holes in the P+ type impurity region 115, which is a heavily doped impurity region. By doing so, electrons are gradually discharged toward the p-type semiconductor substrate 101. Accordingly, active devices (for example, MOS transistor 211) of the internal circuit around P+ type impurity region 115 are prevented from being exposed to the excess voltage.

However, the conventional ESD protecting circuit has the following problems. First, when more than 2,000V of excess voltage caused by the ESD due to CDM is applied through the pad, the excess voltage is applied to the active device of the internal circuit before the ESD protecting circuit begins operating. This may destroy the gate oxide layer of the active device, so that the internal circuit can not be protected from the ESD.

Secondly, the conventional ESD protecting circuit uses a polysilicon resistor, in order to make the ESD protecting circuit operate prior to the internal circuit by delaying the ESD pulse. This prevents the excess voltage from being applied to the internal circuit before the operation of the ESD protecting circuit. Accordingly, since the operating speed is reduced due to the addition of the resistor in the normal operation, the conventional ESD protecting circuit -s not suitable for high integration of semiconductor devices.

SUMMARY OF THE INVENTION

It is an object of the present invention to provide an ESD protecting circuit and a method, in which the ESD characteristic is improved by using the charged device model (CDM) to thereby prevent an internal circuit from being destroyed.

To accomplish the object of the present invention, there is provided an electrostatic-discharge protecting circuit of a semiconductor device for breaking an excess voltage applied to an internal circuit through a pad, in which the thickness of respective gate insulating layers of respective active devices of the electrostatic-discharge protecting circuit and internal circuit, which are formed within a given radius in the range of about 350μm to about 100μm from the electrostatic-discharge protecting circuit, is thicker than that of gate insulating layers of active devices formed outside the given radius.

For the object of the present invention, there is further provided a method for fabricating an electrostatic-discharge protecting circuit of a semiconductor device for breaking an excess voltage applied to an internal circuit through a pad, the method comprising the steps of: isolating field and active regions from each other on a semiconductor substrate, to define electrostatic-discharge protecting circuit and internal circuit portions; and forming a gate insulating layer of an active device formed on the active region of the semiconductor substrate within a given radius in the range of about 350μm to about 1,000μm from the electrostatic-discharge protecting circuit, the layer being thicker than that of an active device formed outside the radius of about 1,000μm from the electrostatic-discharge protecting circuit.

DETAILED DESCRIPTION OF THE INVENTION

Figure 5:
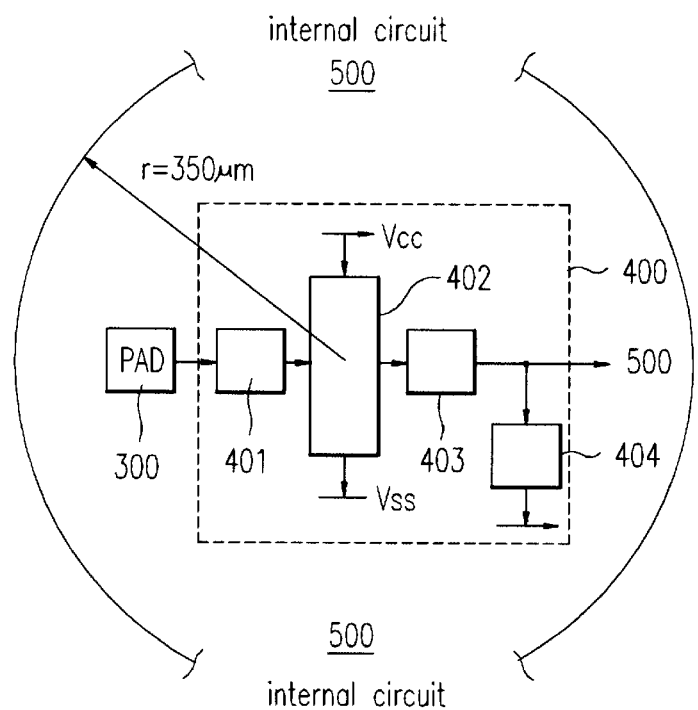
FIG. 5 is a block diagram of an ESD protecting circuit connected to a semiconductor integrated circuit in accordance with the first embodiment of the present invention.
Figure 6:
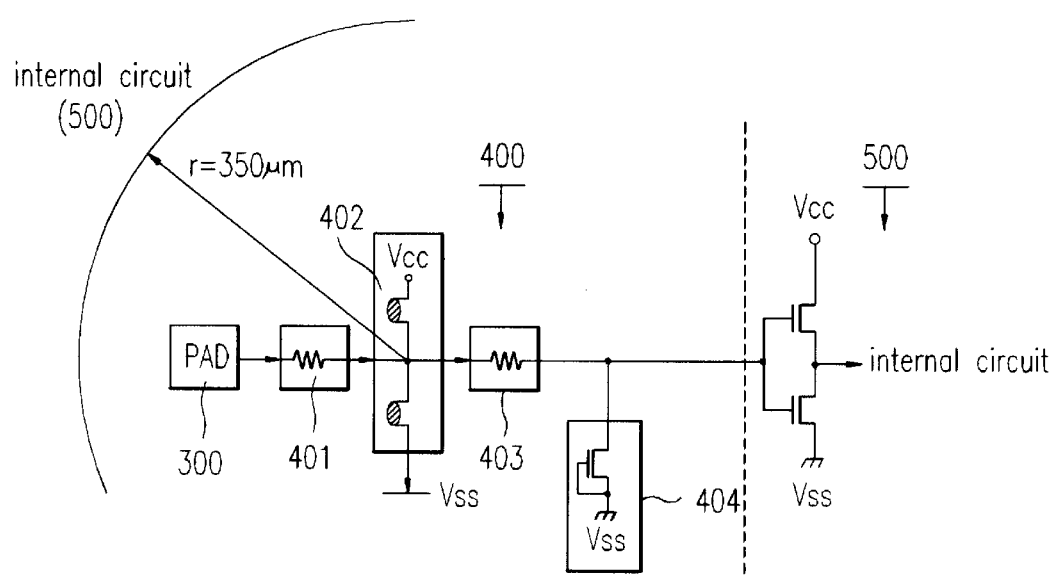
FIG. 6 is a more detailed block diagram of the first embodiment of an ESD protecting circuit in accordance with the present invention.

Preferred embodiments of the present invention will be explained below with reference to the accompanying drawings. FIG. 5 is a layout of a semiconductor device to which an ESD protecting circuit is connected, and FIG. 6 is a block diagram of an ESD protecting circuit of FIG. 5. Referring to FIGS. 5 and 6, an ESD protecting circuit 400 of the present invention: is connected to a pad 300; is located between internal circuits 500 which are placed on both sides of a semiconductor package; and is constructed in such a manner that the internal circuits are protected, from up to about 2,000; V of excess voltage caused by an ESD, due to CDM applied to the internal circuits through pad 300. The ESD protecting circuit 400 has resistors 401 and 403, field transistor 402, and active device 404.

Figure 1:
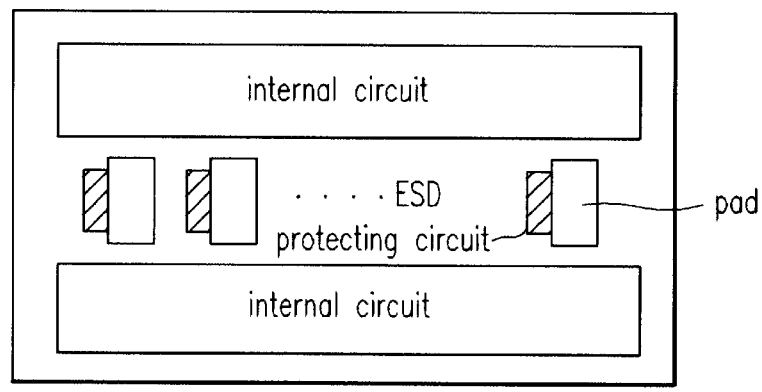
FIG. 1 is a package layout of a general semiconductor integrated circuit.
Figure 2:
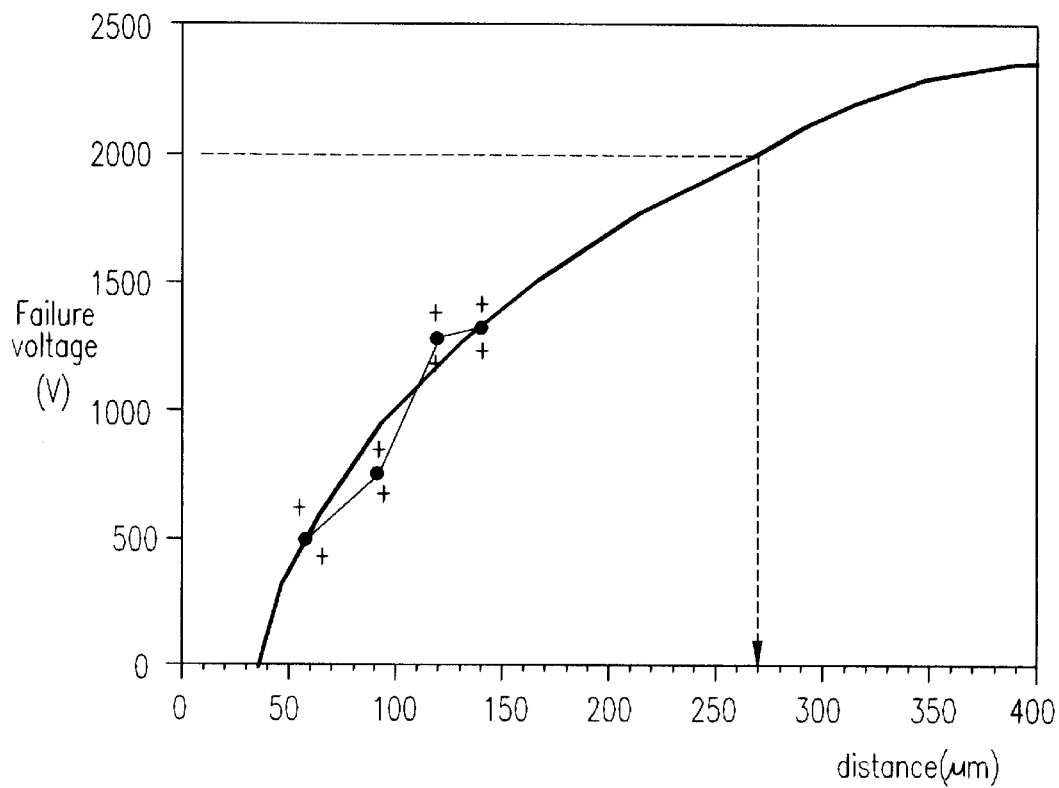
FIG. 2 shows an ESD failure voltage characteristic of the general semiconductor device.
Figure 3:
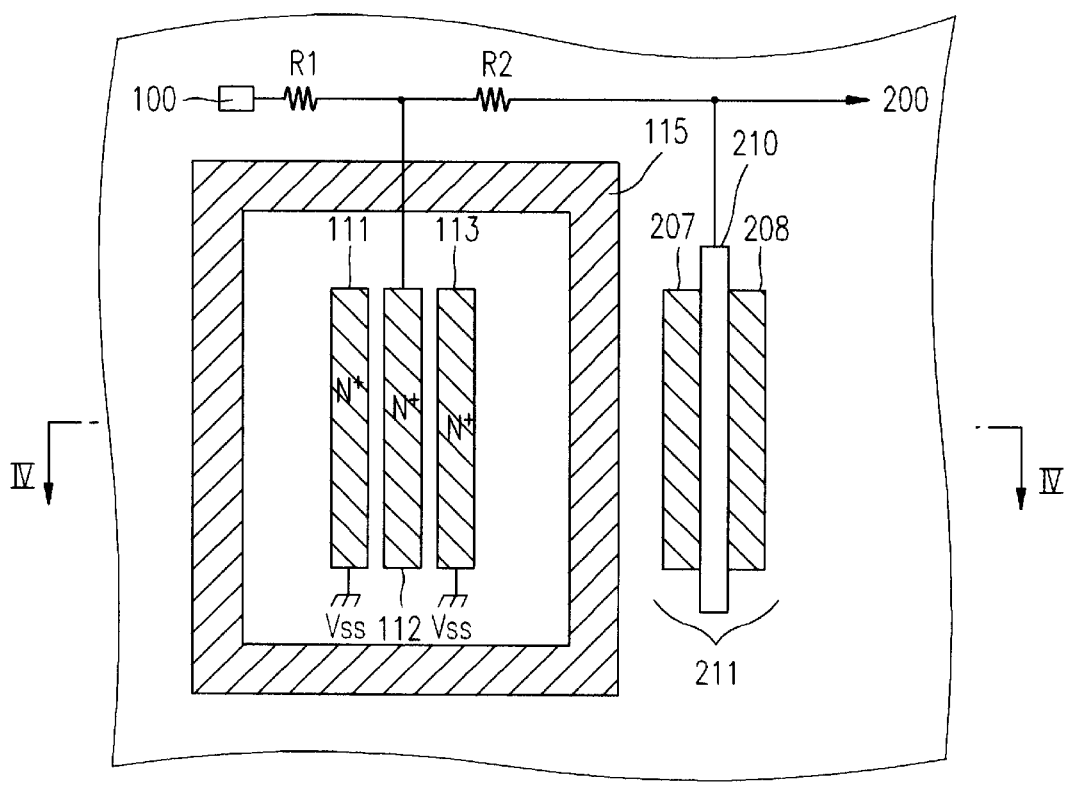
FIG. 3 is a layout of an ESD protecting circuit of a conventional semiconductor device.
Figure 4:
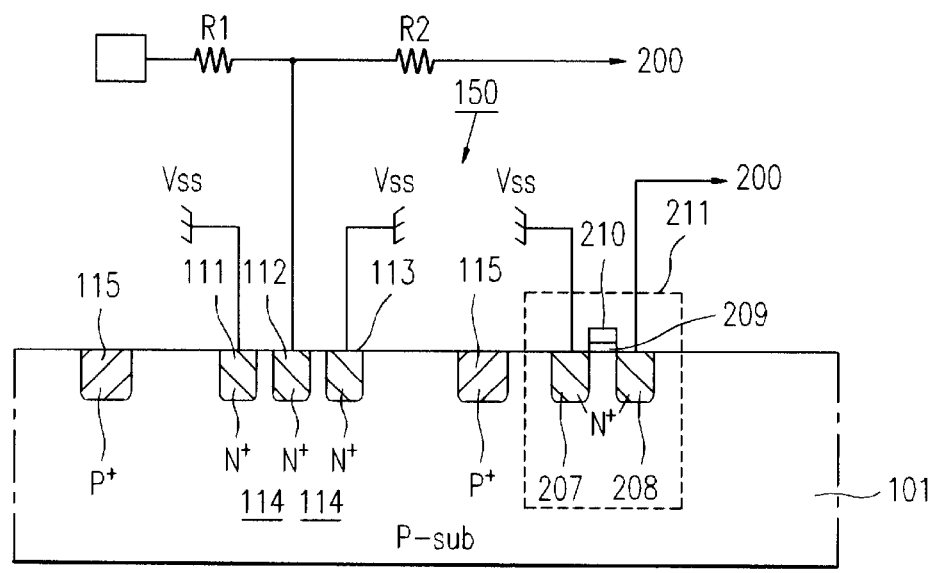
FIG. 4 is a cross-sectional view of the conventional ESD protecting circuit, taken along line IV—IV of FIG. 3.
Figure 7:
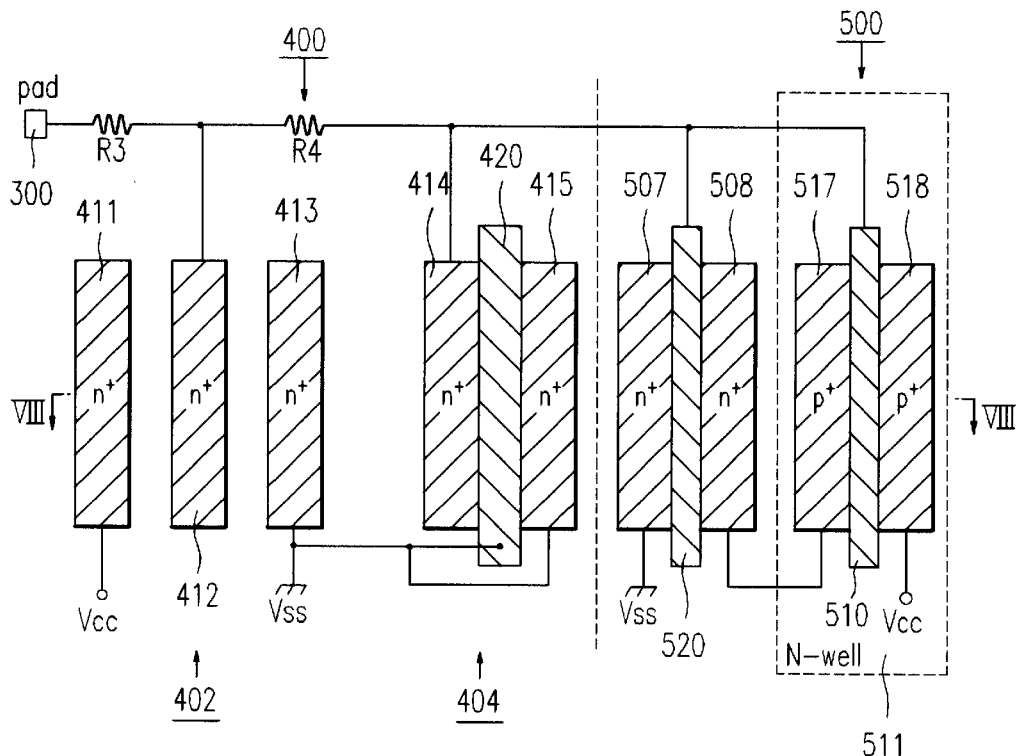
FIG. 7 is a layout of the first embodiment of an ESD protecting circuit in accordance with the present invention.
Figure 8:
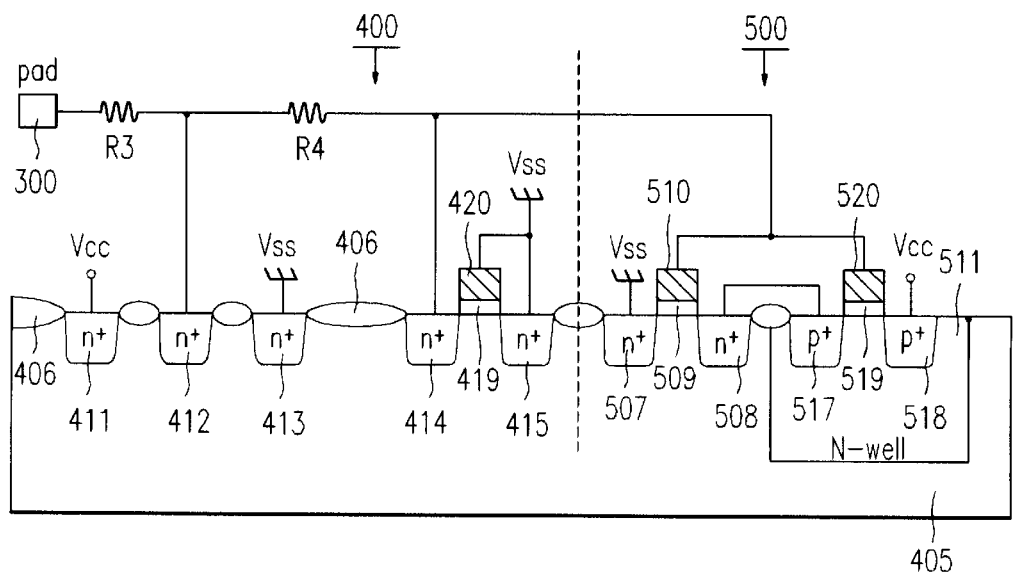
FIG. 8 is a cross-sectional view of an ESD protecting circuit, taken along line VIII—VIII of FIG. 7.

FIG. 7 is a layout of an ESD protecting circuit of the present invention, and FIG. 8 is a cross-sectional view of FIG. 7 along the line VIII—VIII. As shown in FIGS. 7 and 8, the ESD protecting circuit of the present invention is formed between an internal circuit 500 and the signal input pad 300. The signal input pad 300 is connected to the input terminal of internal circuit 500, and resistors R3 and R4 are connected between pad 300 and internal circuit 500. The resistor R3 is a protection resistor, and is formed with a diffusion layer, that is, impurity region formed in a the active region of p-type semiconductor substrate 405; R3 is formed in the same manner as R1 of FIG. 3. The resistor R4 is a parasitic resistor formed in the same manner as R2 of FIG. 3. The field transistor 402 includes the p-type semiconductor substrate 405, and a plurality of first impurity regions 411, 412 and 413 formed on the active region of the p-type semiconductor substrate 405. The active device 404 includes second impurity regions 414 and 415, a gate insulating layer 419, and a gate electrode 420. A method for fabricating the aforementioned ESD protecting circuit will be explained below.

The field oxidizing regions 406 are formed on a p-type semiconductor substrate 405 through field oxidation, and an n+ type impurity is ion-implanted into the active regions of p-type semiconductor substrate 405, which are isolated from one another by the field oxidizing regions 406, to form n+ type impurity regions 411, 412 and 413. Here, the n+ type impurity region 411 is connected to a power supply terminal Vcc, the n+ type impurity region 412 to the input pad 300, and n+ type impurity region 413 to ground Vss.

Then, an oxide layer and a metal layer are sequentially formed on the active region of p-type semiconductor substrate 405 in order to form active device 404 of the input protecting circuit 400, and the metal layer and oxide layer are selectively removed through photolithography to form the gate oxide layer 419 and the gate electrode 420. Successively, ion-implantation is carried out into the p-type semiconductor substrate 405 using the gate electrode 420 as a mask, to form the n+ type impurity regions 414 and 415. By doing so, the active device 404 is completed. Here, the active device 404, and a CMOS transistor, that is, an active device of an internal circuit (explained below), are formed simultaneously.

Meanwhile, the gate electrode 420 and the n+ type impurity region 415 are connected to ground Vss, and the n+ type impurity region 414 is connected to the input pad 300 to be thereby connected to the internal circuit 500. A method for fabricating the CMOS transistor, that is, the active device of internal circuit 500, will be explained below.

First, the active device 404 of the input protecting circuit 400 is formed, and at the same time, a gate oxide layer 509 and a gate electrode 510 are formed on the p-type semiconductor substrate 405. Then, ion-inplantation is carried out into p-type semiconductor substrate 405 using the gate electrode 510 as a mask to form n+type impurity regions 507 and 508. By doing so, an n-type MOS transistor is accomplished. Here, the n+ type impurity region 507 is connected to ground Vss.

The n+ type impurity is ion-implanted into the active region of p-type semiconductor substrate 405 to form an n-type well 511. Then, a gate oxide layer 519 and a gate electrode 520 are formed on the n-type well 511 of the p-type semiconductor substrate 405. This process is carried out simultaneously with the process of forming the respective gate insulating layers of the active device 404 of the input protecting circuit, and the n-type MOS transistor of the internal circuit 500. Successively, p+ type impurity is ion-implanted into the p-type semiconductor substrate 405 using gate electrode 520 as a mask to form p+ type impurity regions 517 and 518. By doing so, a p-type MOS transistor is accomplished. Here, the p+ type impurity region 517 is connected to n+ type impurity region 508 of the n-type MOS transistor, and gate electrode 520 is connected to the input pad 300 together with the gate electrode 510 of the n-type MOS transistor. The p-type impurity region 518 is connected to power supply terminal Vcc. The CMOS transistor, which is part of the active devices forming the internal circuit 500 as shown in FIG. 6, is accomplished as described above.

In the ESD protecting circuit according to the aforementioned construction, gate oxide layers (that is, gate oxide layers of the active devices of the input protecting circuit and the active device of the internal circuit), which are formed within the radius of about 350μm from ESD protecting circuit 400, are formed by a thickness thicker than that of the gate oxide layers (that is, gate oxide layers of other active devices of the internal circuit) formed outside the radius of about 350μm from the ESD protecting circuit. This is for preventing the active devices within a predetermined distance from input protecting circuit 400, such as the CMOS transistor of internal circuit 500, from being destroyed by an excess voltage caused by the ESD. Here, experimentation has shown that the 350μm radius from the ESD protecting circuit 400 may be selectively adjusted up to about 1,000μm as the case may be.

Accordingly, the thickness of gate oxide layers 509 and 519 constructing the active devices of internal circuit 500, formed within the radius of about 350μm from input protecting circuit 400, are thicker than that in the conventional device, so that the gate oxide layers of the active devices are prevented from being destroyed by an excess voltage caused by the ESD. This will be explained below in more detail.

If the ESD is applied to pad 300, ESD protecting circuit 400 operates to emit ESD energy (voltage). At this time, if the emission of ESD energy is delayed, the charge caused by the ESD destroys weak portions of internal circuit 500, that is, gate oxide layers 509 and 519. Accordingly, thickening the gate oxide layers 419, 509 and 519, formed within the radius of about 350μm from protecting circuit 400, prevents them from being destroyed.

Figure 9A:
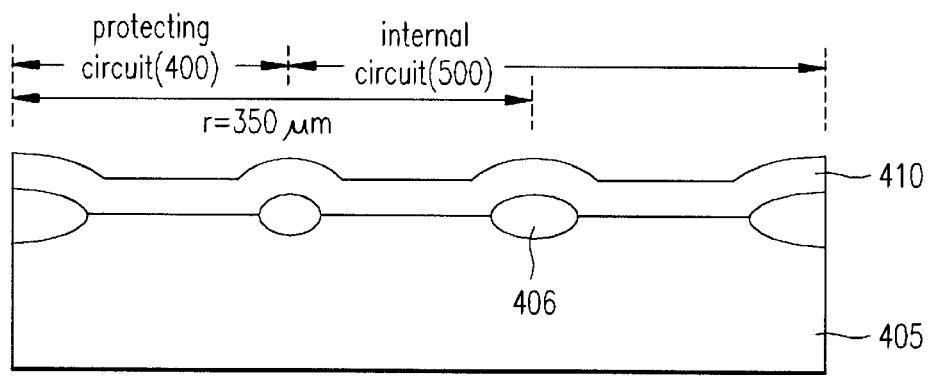
FIGS. 9A to 9D are cross-sectional views showing a process for fabricating the first embodiment of an ESD protecting circuit in accordance with the present invention.

FIGS. 9A to 9D are cross-sectional views showing a process of forming the thick gate oxide layers 419 and 509, which are formed within the radius of about 350μm from protecting circuit 400. First, as shown in FIG. 9A, the field oxidizing region 406 is formed on p-type semiconductor substrate 405 through field oxidation. Then, a portion on which ESD protecting circuit 400 will be formed, and a portion on which internal circuit 500 will be formed are defined, and a photoresist 410 is coated on the p-type semiconductor substrate 405 (including internal circuit 500 formed within the radius of about 350μm from the protecting circuit 400).

Figure 9B:
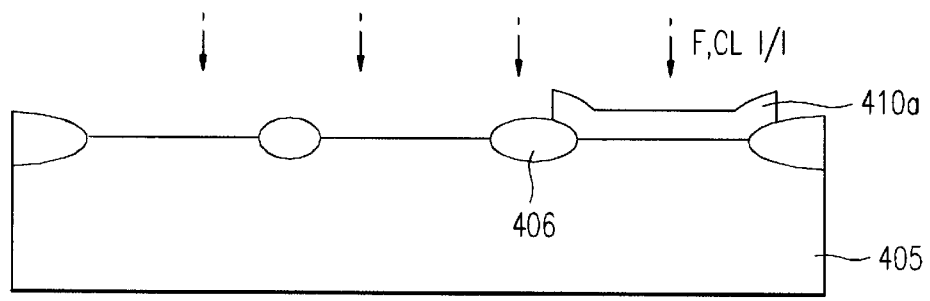

As shown in FIG. 9B, photoresist 410 is selectively removed by the exposure and development process to form a photoresist pattern 410a, to thereby define a portion within the radius of about 350μm from protecting circuit 400. Then, before forming gate oxide layers of the active devices, fluorine (F) and chlorine (Cl) are ion-implanted into the substrate within the radius of about 350μm. This is to make the gate oxide layers within the radius of about 350μm thicker than that formed outside the radius of about 350μm from the protecting circuit 400.

Figure 9C:
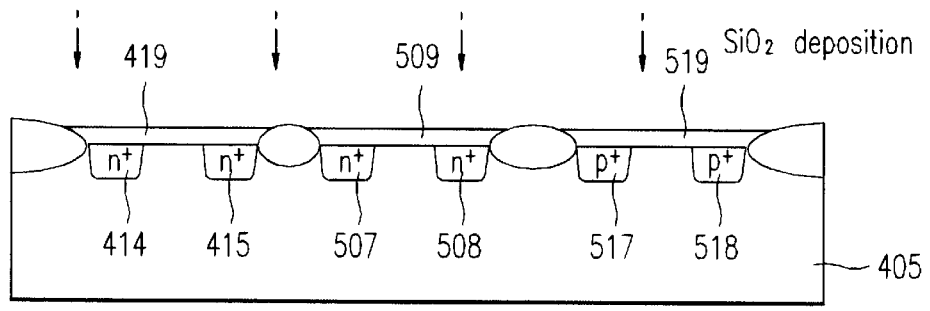
Figure 9D:
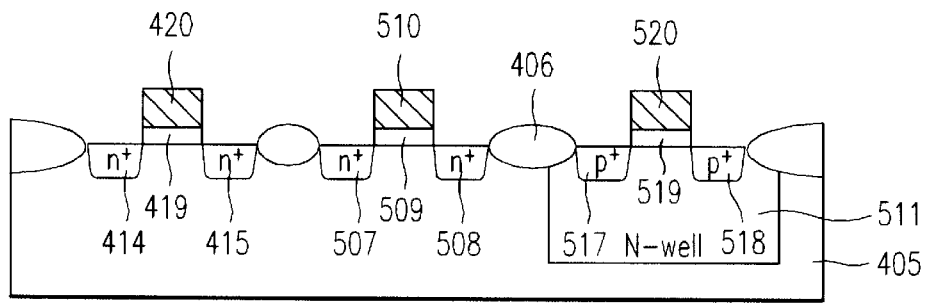

As shown in FIG. 9C, photoresist pattern 410a is removed, and an oxide layer is formed on the p-type semiconductor substrate 405, to form gate oxide layers 419, 509 and 519 having different thicknesses. Then, as shown in FIG. 9D, gate electrodes and impurity regions are sequentially formed, accomplishing the respective active devices of the ESD protecting circuit and the internal circuit. By doing so, the gate oxide layers 419 and 509 (formed within the radius of about 350μm from protecting circuit 400) are thicker than that of gate oxide layer 519 of the active device formed outside the radius of about 350μm from protecting circuit 400.

Figure 10:
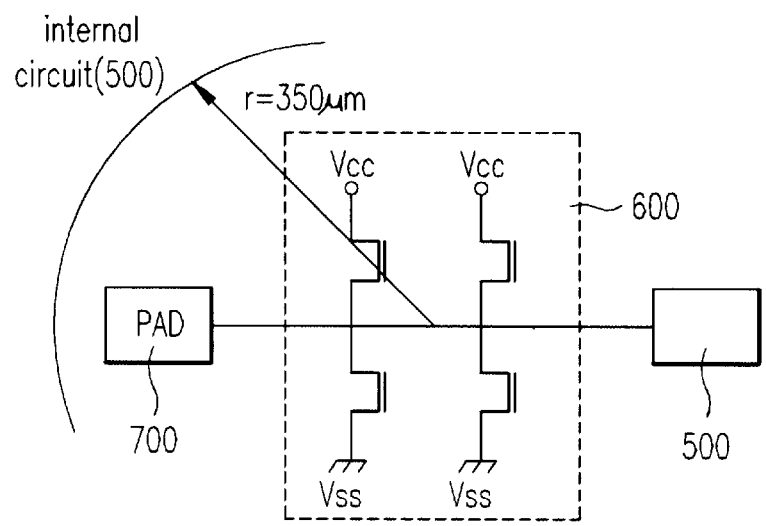
FIG. 10 is a block diagram of the second embodiment of an ESD protecting circuit in accordance with the present invention.
Figure 11:
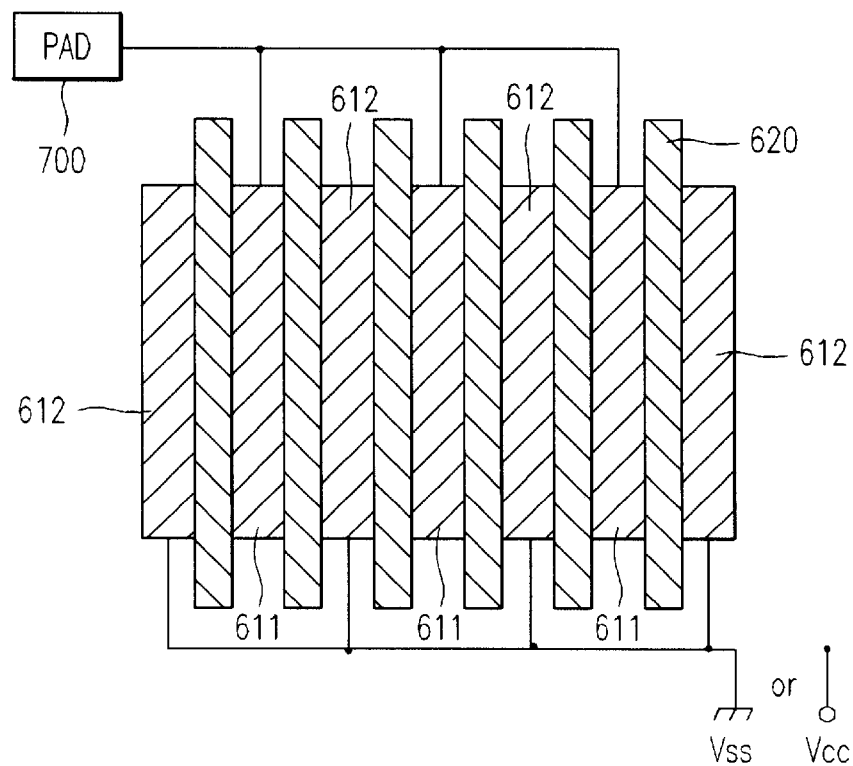
FIG. 11 is a layout of the second embodiment of an ESD protecting circuit in accordance with of the present invention.
Figure 12:
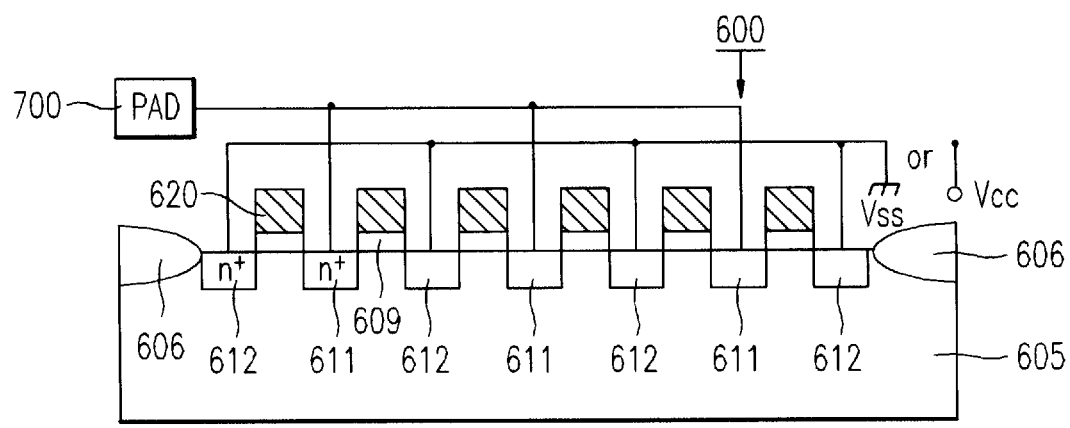
FIG. 12 is a cross-sectional view of the second embodiment of an ESD protecting circuit in accordance with of the present invention.

Meanwhile, if an excess voltage is applied to the drain of the output side active device of the internal circuit, excess charge, for example, hot carriers, is generated. If this excess charge is given to the gate oxide layer, the gate oxide layer is destroyed, and thus the characteristic of the device is deteriorated. The configuration of an output protecting circuit in accordance with a second embodiment of the present invention is shown in FIG. 10, which is to protect the internal circuit, that is, the output-side active device of the internal circuit, from an excess voltage caused by the above phenomenon. FIG. 11 is a layout of the output protecting circuit of FIG. 10, and FIG. 12 is a cross-sectional view of the output protecting circuit according to the second embodiment of the present invention.

An output protecting circuit 600 consists of a pull-up transistor and pull-down transistor. The source region of the pull-up transistor is connected to an output signal pad 700, and drain region thereof is connected to ground Vss. That is, as shown in FIG. 12, the output protecting circuit 600 is formed between field oxidizing regions 606 and includes a plurality of gate insulating layers 609 formed on the active regions of the p-type semiconductor substrate 605, gate electrodes 620 formed on the gate insulating layers 609, and a plurality of n+ type impurity regions 611 and 612 formed on a portion of the p-type semiconductor substrate 605 on both sides of the gate electrodes 620. Here, the n+ type impurity region 611 is connected to the output signal pad 700, and the n+ type impurity region 612 to the voltage supply terminal Vcc or ground Vss.

In the output protecting circuit constructed in the above configuration, similar to the input protecting circuit, the gate oxide layers of the active device (including the active devices of the output protecting circuit and a part of the active devices of the internal circuit), formed within the radius of about 350$\mu$m from the output protecting circuit 700, are formed to a thickness thicker than that of the gate oxide layers of the active devices formed outside the radius of about 350$\mu$m. Accordingly, even if an excess voltage is applied to the output-side active device, the gate oxide layers are not destroyed.

The method for forming the gate oxide layers (the gate oxide layers of the output protecting circuit and a part of the active devices of the internal circuit), formed on the p-type semiconductor substrate, thicker than that of the other active devices formed outside the radius of about 350$\mu$m from the output protecting circuit 700, is the same as that for forming the input protecting circuit of the present invention shown in FIGS. 9A to 9D. Also, the radius of about 350$\mu$m can be selectively adjusted up to about 1000$\mu$m.

As described above, in the ESD protecting circuit in accordance with the present invention, the gate insulating layers (the gate insulating layers of the active devices of the ESD protecting circuit and a part of the active devices of the internal circuit), formed within a given radius in the range of about 350$\mu$m to about 1000$\mu$m from the ESD protecting circuit, are formed thicker than that formed on other portions, so that the gate insulating layers of the internal circuit are prevented from being destroyed by the excess voltage caused by the ESD.

Figure 13:
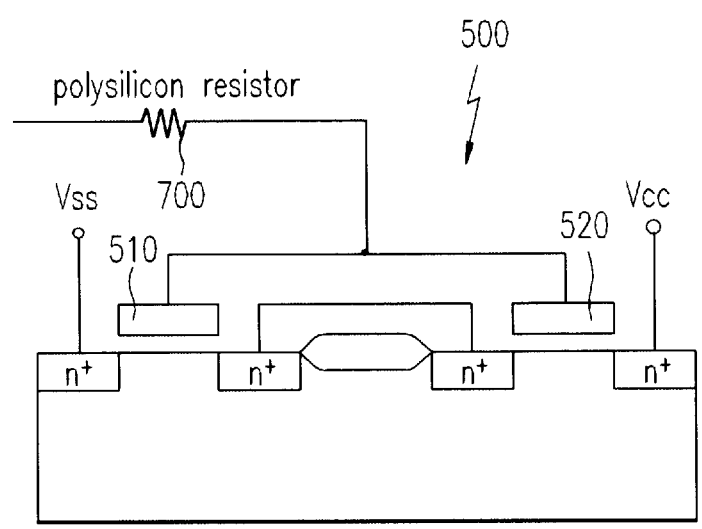
FIG. 13 is an alternative way to connect the internal circuit 500 of FIG. 8 to the ESD protecting circuit 400.

FIG. 13 depicts an alternative way to connect the ESD protecting circuit 400 of FIG. 8 to the internal circuits 500, i.e., via a polysilicon resistor 700. This resistor 700, however, can be omitted because of the efficacy of the ESD protecting circuit, e.g., 400, of the present invention. Hence, the problem in the prior art of having to reduce the size of such a polysilicon resistor has been eliminated. This prevents the operating speed of the output protecting circuit from being delayed due to the resistance of the polysilicon resistor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit (IC) architecture for electrostatic-discharge (ESD) protection, the architecture comprising:

a substrate;

a protector circuit, formed at least partially into said substrate, for depleting ESD voltage;

said substrate being arranged to include a circular region surrounding, and being substantially centered about a center of, said protector circuit; and an internal circuit to be protected from said ESD voltage by said protector circuit, formed at least partially into said substrate, said internal circuit including a plurality of field effect transistors (FETs) each having a gate insulating layer;

a first portion of said internal circuit being located within said circular region, said first portion including at least a first one of said plurality of FETs, the first FET having a gate insulating layer of a first thickness; and a second portion of said internal circuit being located outside of said circular region, said second portion including at least a second one of said plurality of FETs, the second FET having a gate insulating layer of a second thickness smaller than said first thickness.

2. The architecture of claim 1, wherein said protecting circuit includes at least one FET having a third gate insulating layer, a thickness of the third gate insulating layer being thicker than the thickness of the second gate insulating layer.

3. The architecture of claim 2, wherein the thickness of the third gate insulating layer is substantially equal to the thickness of the first gate insulating layer.

4. The architecture of claim 1, wherein the circular region has a radius in the range of about 350$\mu$m to about 1000$\mu$m.

5. The architecture of claim 1, wherein the radius is about 350$\mu$m or about 1000$\mu$m.

6. The architecture of claim 1, further comprising:

an input pad for said internal circuit, located within said circular region, said protector circuit being connected to said input pad and protecting against excessive voltage received on said input pad.

7. The architecture of claim 1, further comprising:

an output pad for said internal circuit, located within said circular region, said protector circuit being connected to said output pad and protecting against excessive voltage received on said output pad.

* * * * *